(12) United States Patent
Yang et al.

(10) Patent No.: US 12,156,348 B2
(45) Date of Patent: Nov. 26, 2024

(54) EMBEDDED CIRCUIT BOARD AND MANUFACTURING METHOD THEREOF

(71) Applicants: QING DING PRECISION ELECTRONICS (HUAIAN) CO., LTD, Huai an (CN); Avary Holding (Shenzhen) Co., Limited., Shenzhen (CN)

(72) Inventors: Cheng-Yi Yang, Shenzhen (CN); Hao-Wen Zhong, Shenzhen (CN); Biao Li, Shenzhen (CN); Ming-Jaan Ho, New Taipei (TW); Ning Hou, Shenzhen (CN)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 0 days.

(21) Appl. No.: 18/398,552

(22) Filed: Dec. 28, 2023

(65) Prior Publication Data

US 2024/0130050 A1    Apr. 18, 2024

Related U.S. Application Data

(60) Division of application No. 17/709,852, filed on Mar. 31, 2022, which is a continuation-in-part of
(Continued)

(51) Int. Cl.
H05K 3/46     (2006.01)
H05K 1/18     (2006.01)

(52) U.S. Cl.
CPC .......... *H05K 3/4644* (2013.01); *H05K 1/183* (2013.01); *H05K 1/186* (2013.01)

(58) Field of Classification Search
CPC ...... H05K 1/183; H05K 3/4644; H05K 1/186; H05K 3/4697
See application file for complete search history.

(56) References Cited

U.S. PATENT DOCUMENTS 8,222,747 B2 *   7/2012   Machida ............. H01L 23/5389
                                                                    174/257
2016/0270233 A1*  9/2016  Ha ........................ H05K 1/115
(Continued)

FOREIGN PATENT DOCUMENTS

CN    1625927 A    6/2005
JP    2006032748 A  2/2006
(Continued)

*Primary Examiner* — Sherman Ng
(74) *Attorney, Agent, or Firm* — ScienBiziP, P.C.

(57) ABSTRACT

An embedded circuit board, made without gas bubbles or significant internal gaps according to a manufacturing method which is provided, includes an inner layer assembly, an embedded element, and first and second insulating elements. The inner layer assembly comprises a first main portion with opposing first and second surfaces and a first groove not extending to the second surface is positioned at the first surface. A first opening penetrates the second surface, and the first opening and the first groove are connected. The first groove carries electronic elements for embedment. The first insulating element covers the first surface and a surface of the embedded element away from the second surface. The second insulating element covers the second surface and extends into the first opening to be in contact with the embedded element.

7 Claims, 6 Drawing Sheets

Related U.S. Application Data application No. PCT/CN2020/098935, filed on Jun. 29, 2020.

(56) References Cited

U.S. PATENT DOCUMENTS

| | | | |
|---|---|---|---|
| 2022/0051972 A1* | 2/2022 | Kim | ......................... H01L 23/13 |
| 2023/0207442 A1* | 6/2023 | Kim | .................... H01L 23/5389 |
| | | | 257/668 |

FOREIGN PATENT DOCUMENTS

| | | |
|---|---|---|
| TW | 200822833 A | 5/2008 |
| TW | 202015497 A | 4/2020 |

\* cited by examiner

EMBEDDED CIRCUIT BOARD AND MANUFACTURING METHOD THEREOF

FIELD

The subject matter relates to circuit board and manufacturing method thereof, in particular to embedded circuit board and manufacturing method thereof.

BACKGROUND

In electronic products today, lightness, thinness, and smallness are the desirable features. The circuit board is the main component of the electronic product, and occupies most of space inside the electronic product. The volume of the circuit board largely determines the size of the electronic product. Large circuit boards are not suitable for light, thin, short, and small electronic products. For miniaturization, electronic components are embedded inside the circuit board, the connection path between the components is thus shortened, and transmission losses are reduced. The embedded circuit board allows for increased miniaturization.

However, in the current embedding process, the colloid material flows to fill gaps around and beneath each element. However, the element itself and the pads at both ends can act as blockages to the flow of colloid, so no residual gas is compressed at the bottom of the element and is not forced out. As the bonding process progresses, the gas is finally squeezed and distributed at the bottom of the component and the edge of the pad. Then, air bubbles are formed inside the embedded circuit board, negatively affecting the quality of the embedded circuit board. Even by changing the glue content of the prepreg (or film) to improve the fluidity of the colloid, and optimizing the circuit pattern design, it is difficult to avoid bubble formation inside the embedded circuit board.

How to solve the above problems is what those skilled in the art need to consider.

SUMMARY

The purpose of the invention is to manufacture a bubble-free embedded circuit board.

An embedded circuit board, comprising:
an inner layer assembly, wherein the inner layer assembly comprises a first main portion, a first surface and a second surface are arranged on opposite sides of the first main portion, a first groove is positioned at the first surface, the first groove does not extend to the second surface, a first opening penetrates the second surface and communicates with the first groove;
an embedded element, the embedded element is arranged in the first groove;
a first insulating element covers the first surface and a surface of the embedded element away from the second surface; and
a second insulating element which covers the second surface, the second insulating element extending into the first opening and being in contact with the embedded element.

Furthermore, the first groove comprises a side wall and a bottom wall, the side wall is connected to the first surface and the bottom wall, and the first opening connects the bottom wall and the second surface, the first opening being filled with the second insulating element.

Furthermore, the inner layer assembly further comprises a first connection layer and a second connection layer, the first connection layer is electrically connected to the second connection layer, the first connection layer is arranged on the bottom wall and the side wall, the first connection layer is electrically connected with the first main portion, and the second connection layer is arranged on a side of the first connection layer adjacent to the embedded element. The second connection layer is electrically connected to the embedded element.

Furthermore, a first main portion is used, the same comprising:
an inner layer conductive component, the inner layer conductive component comprises a core board, an insulating substrate, and an inner layer conductive circuit, the insulating substrate and the inner layer conductive circuit are sequentially stacked and arranged on two sides of the core board, the first groove completely penetrating the inner layer conductive component;
a first insulating layer, the first insulating layer covers the surface of the inner layer conductive component adjacent to the first surface and facing the first groove;
a second insulating layer, the second insulating layer covers the surface of the inner layer conductive component adjacent to the second surface, the second insulating layer extends toward the first groove, and the first opening penetrates the second insulating layer, the first insulating layer being connected to the second insulating layer;
a first conductive circuit, the first conductive circuit is disposed on the surface of the first insulating layer away from the inner layer conductive component, and the first conductive circuit not covered by the inner layer conductive component is also disposed on the surface of the second insulating layer away from the second surface;
a second conductive circuit disposed on the surface of the second insulating layer away from the inner layer conductive component and the first groove.

Furthermore, the embedded circuit board further comprises:
a first outer layer circuit disposed on the surface of the first insulating element away from the second insulating element;
a second outer layer circuit disposed on the surface of the second insulating element away from the first insulating element; and
a solder mask layer disposed on the sides of the first and second outer layer circuits away from the inner layer assembly.

The step of providing an inner layer conductive component comprises the steps of:
providing an inner layer conductive component, wherein the inner layer conductive component comprises a core board, an insulating substrate, and an inner layer conductive circuit, the insulating substrate and the inner layer conductive circuit are sequentially stacked and arranged on two sides of the core board, a first slot is formed on the inner layer conductive component, the first slot completely penetrates the inner layer conductive component;
providing a first insulating layer, a second insulating layer, a first conductive material layer, and a second conductive material layer, wherein a second slot is formed in the first insulating layer, making a position of the first slot correspond to a position of the second slot, the second insulating layer is arranged on a side of the inner layer conductive component away from the first insulating layer, and the first conductive material layer is arranged on the first insulating layer away from the inner layer conductive component on a side of a conductive assembly, the second conductive material layer is arranged on a side of the second insulating layer away from an inner conductive assembly;

pressing the first insulating layer, the second insulating layer, the first conductive material layer, the second conductive material layer, and the inner layer conductive component to form a first groove;

processing the first conductive material layer to obtain a first conductive circuit, processing the second conductive material layer to obtain a second conductive circuit, removing a part of the second insulating layer that does not cover by the first conductive circuit and the second conductive circuit to obtain a first opening, thereby obtaining an inner layer assembly;

providing an embedded element, and disposing the embedded element in the first groove; and providing a first insulating element and a second insulating element, making the first insulating element and the second insulating element cover an outer surface of the inner layer assembly, and cover exposed surfaces on opposite sides of the embedded element.

Furthermore, the manufacturing of the inner layer conductive component comprises the following steps:

providing the core board, wherein the core board comprises a center layer and two center conductive circuits, and the two center conductive circuits are respectively arranged on two sides of the center layer;

sequentially laminating an insulating substrate and a conductive layer on each of two sides of the core board;

photo-etching the conductive layer to obtain the inner layer conductive circuit; and the first slot is formed through multiple layers of the inner layer conductive circuit and the insulating substrate.

Furthermore, the first insulating layer covers a surface of the inner conductive assembly facing the first groove, the first insulating layer extends from a surface of the inner layer conductive component away from the second insulating layer to the surface of the inner layer conductive component facing the first groove, the first insulating layer is connected to the second insulating layer.

Furthermore, the process of placing the embedded element in the first groove comprises the following steps:

forming a first connection layer on a surface of the first conductive circuit disposed on the first groove by Electroless Nickel/Immersion Gold (ENIG), making the first connection layer electrically connected to the first conductive circuit;

disposing a conductive paste on a surface of the first connection layer away from the first conductive circuit to form a second connection layer, making the second connection layer electrically connected to the first connection layer; and putting the embedded element in the first groove, making the embedded element be fixed to the inner layer assembly, and making the embedded element be electrically connected to the second connection layer.

Furthermore, the first insulating element and the second insulating element are formed by pressure buildup, the inner layer assembly comprises a first surface and a second surface disposed opposite to each other, the first groove does not extend to the second surface, the first opening penetrates the second surface and communicates with the first groove, the first insulating element covers the first surface and a surface of the embedded element away from the second surface, the second insulating element covers the second surface and contacts the embedded element through the first opening, the manufacturing method further comprising:

forming a first outer layer circuit on a surface of the first insulating element away from the second insulating element;

forming a second outer layer circuit on a surface of the second insulating element away from the first insulating element; and forming a solder mask layer on a side of the first outer layer circuit away from the inner layer assembly and a side of the second outer layer circuit away from the inner layer assembly.

Compared to prior art, a through opening structure is pre-set in the area where the embedded component is placed on the embedded circuit board. Therefore, during the installation process of the embedded element, the colloid can enclose the embedded element from all directions. On the one hand, gas can be exhausted, and gas bubbles below the embedded element due to the inability of the gas to escape can be avoided. On the other hand, the gap between the embedded element and the connection layers are infilled by the first insulating element and the second insulating element, the bonding strength between the embedded element and the inner layers assembly is improved, and the product quality is improved. The bottom of the first groove supports the embedded component; the embedded component is fixed in place by the first groove, so as to prevent the embedded component from being displaced and improve the precision of the process. In addition, the connection layer for fixing the embedded element is arranged in the first groove, so gaps in the product are avoided or reduced in size, the use of colloid is reduced, and a light, thin, and miniaturized circuit board is realized.

DETAILED DESCRIPTION

The following descriptions refer to the attached drawings. Sample embodiments of this application are shown in the attached drawings. However, this application can be implemented in many different forms and should not be construed as limited to exemplary embodiments set forth herein. These exemplary embodiments are provided to make this application thorough and complete, and to adequately communicate the scope of this application to those skilled in the field. Similar diagram tags represent the same or similar assemblies.

The terms used herein are intended only to describe the purpose of particular exemplary embodiments and are not intended to limit this application. As used herein, the singular forms "one," "one" and "the" are intended to include the plural as well as the singular, unless the context otherwise clearly indicates it. In addition, when used herein, the words "include" and/or "include" and/or "have," integers, steps, operations, assemblies and/or assemblies, without excluding the existence or addition of one or more other features, regions, integers, steps, operations, assemblies, assemblies and/or groups thereof.

Unless otherwise defined, all terms used herein (including technical and scientific terms) have the same meaning as would normally be understood by ordinary technicians in the field of this application. In addition, unless expressly defined in the context, terms such as those defined in a general dictionary shall be construed to have meanings consistent with those in the relevant technology and in the content of this application, and shall not be construed to have idealistic or overly formal meanings.

Examples of embodiments are described below in combination with the attached drawings. It should be noted that the assemblies depicted in the attached drawings may not be shown to scale. The same or similar assemblies will be assigned the same or similar drawing mark representation or described in similar technical terms.

The following is a detailed description of specific implementations of this application by reference to the attached drawings.

Figure 1:
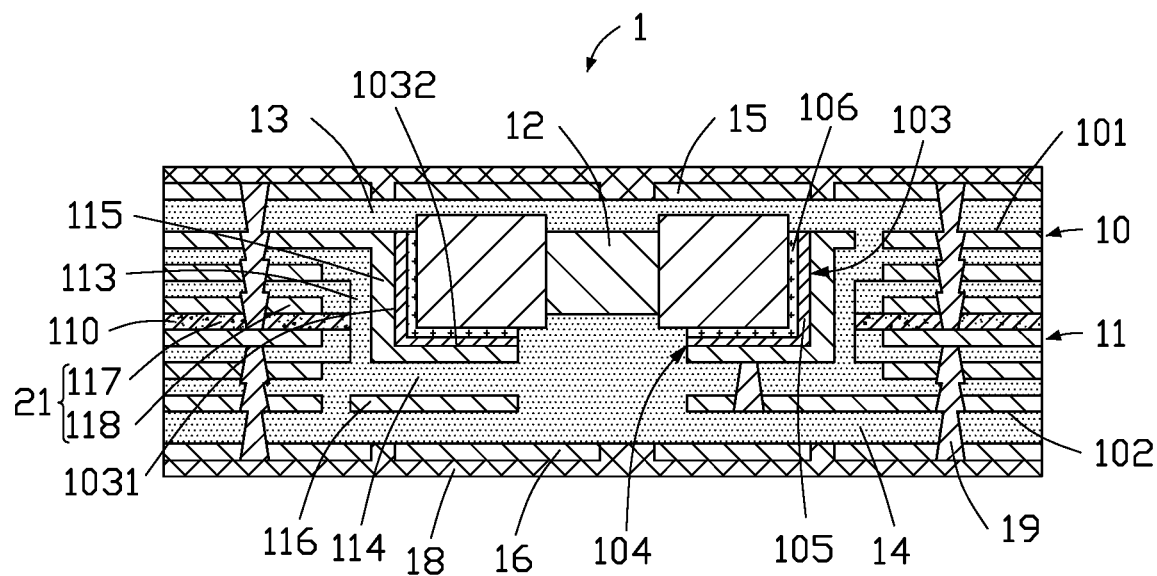
FIG. 1 is a cross-sectional view illustrating an embedded circuit board.

As shown in FIG. 1, an embedded circuit board 1 includes an inner layer assembly 10, an embedded component 12, a first insulating component 13, a second insulating component 14, a first outer layer circuit 15, a second outer layer circuit 16, and a solder mask layer 18.

The inner layer assembly 10 includes a first main portion 11. The first main portion 11 includes a first surface 101 and a second surface 102 on opposing sides of the first main portion 11. A first groove 103 is formed by recessing the first surface 101 toward the first main portion 11. The first groove 103 does not extend to the second surface 102. A first opening 104 penetrates the second surface 102 and communicates with the first groove 103.

The first main portion 11 includes an inner layer conductive component 110, a first insulating layer 113, a second insulating layer 114, a first conductive circuit 115 and a second conductive circuit 116.

The inner layer conductive component 110 includes a core board 21, an insulating substrate 112 and an inner layer conductive circuit 111. The insulating substrate 112 and the inner layer conductive circuit 111 are stacked and disposed on each of two sides of the core board 21 in sequence, and the inner layer conductive component 110 further includes a first slot 27. The first slot 27 completely penetrates the inner layer conductive component 110.

In one embodiment, the core board 21 includes a center layer 117 and two center conductive circuits 118. The center conductive circuits 118 are on either side of the center layer 117. The two center conductive circuits 118 are electrically connected by conductive pillars 19.

The first insulating layer 113 covers the surface of the inner layer conductive component 110 close to the first surface 101. The first insulating layer 113 covers the surface of the inner layer conductive component 110 facing the first groove 103.

The second insulating layer 114 covers the side of the inner layer conductive element 110 close to the second surface 102 and extending to the first groove 103. The first opening 104 penetrates the second insulating layer 114. The first insulating layer 113 is connected to the second insulating layer 114.

In one embodiment, the embedded circuit board 1 includes a plurality of conductive pillars 19. The inner layer conductive circuits 111 in the inner layer conductive component 110 are electrically connected through the conductive pillars 19.

In one embodiment, the first groove 103 completely penetrates the inner layer conductive element 110. The first groove 103 does not completely penetrate the first main portion 11. The first groove 103 does not penetrate the second insulating layer 114. The first insulating layer 113 extends along the sidewall of the slot of the inner layer conductive component 110. The first insulating layer 113 is connected to the second insulating layer 114 and these form an encapsulating structure.

The first conductive circuit 115 is disposed on the surface of the first insulating layer 113 away from the inner layer conductive element 110. The first conductive circuit 115 is disposed on the surface of the second insulating layer 114 away from the second surface 102 and is not covered by the inner layer conductive element 110.

In one embodiment, the first conductive circuit 115 can extend from the outer surface of the inner layer conductive element 110 to the first groove 103 to cover the surfaces of the first insulating layer 113 and the second insulating layer 114. The first conductive circuit 115 may be electrically connected to the inner layer conductive component 110 through the conductive pillar 19.

The second conductive circuit 116 is disposed on the surface of the second insulating layer 114 away from the inner layer conductive element 110 and the first groove 103. The second conductive circuit 116 may be electrically connected to the inner layer conductive component 110 through the conductive pillar 19.

The first groove 103 includes a side wall 1031 and a bottom wall 1032. The side wall 1031 is connected to the first surface 101 and the bottom wall 1032. The first opening 104 is connected to the bottom wall 1032 and the second surface 102.

The inner layer assembly 10 further includes a first connection layer 105 and a second connection layer 106. The first connection layer 105 is electrically connected to the second connection layer 106. The first connection layer 105 is disposed on the bottom wall 1032 and the side wall 1031 and is electrically connected to the first main portion 11. The second connection layer 106 is disposed on the side of the first connection layer 105 close to the embedded element 12. The second connection layer 106 is electrically connected to the embedded element 12.

In one embodiment, the first connection layer 105 may be a layer of metal, such as a nickel layer, a gold layer, a tin layer, etc.; the second connection layer 106 may be a conductive paste.

The embedded element 12 is disposed in the first groove 103. The embedded element 12 is electrically connected to the second connection layer 106. In one embodiment, the embedded element 12 may be an active element or a passive element. In one embodiment, the length of the embedded element 12 is less than the length of the first groove 103, and the width of the embedded element 12 is less than the width of the first groove 103. The first groove 103 fixes the embedded element 12 in place to improve the positioning accuracy of the embedded element 12.

In one embodiment, the embedded element 12 includes two terminals disposed at the ends. The two terminals are rectangles with a side length a. The length of one of the terminals disposed on the bottom wall 1032 is greater than a/2. The distance of the terminal beyond the bottom wall 1032 ranges from 0 to a/3.

In one embodiment, the distance from the edge of the embedded element 12 to the first connection layer 105 ranges from 30 μm to 100 μm. The thickness of the second insulating layer 114 is greater than 50 μm. The length of the buried element 12 beyond the upper boundary of the first groove 103 adjacent to the first surface 101 ranges from −50 μm to 50 μm.

The first insulating element 13 covers the first surface 101 and the side of the embedded element 12 away from the second surface 102. The first insulating element 13 is formed by solidifying a semi-fluid or fluid insulating material.

The second insulating element 14 covers the second surface 102. The second insulating element 14 is in contact with the embedded element 12 through the first opening 104. The second insulating element 14 is formed by solidifying a semi-fluid or fluid insulating material. The second insulating element 14 fills the first opening 104 and covers at least part of the surface of the embedded element 12 during the formation process.

The first outer layer circuit 15 is disposed on the surface of the first insulating element 13 away from the second insulating element 14. The first outer layer circuit 15 is electrically connected to the first conductive circuit 115 through the conductive pillar 19.

The second outer layer circuit 16 is disposed on the surface of the second insulating element 14 away from the first insulating element 13. The second outer layer circuit 16 is electrically connected to the second conductive circuit 116 through the conductive pillar 19.

The solder mask layer 18 is disposed on the sides of the first outer layer circuit 15 and the second outer layer circuit 16 away from the inner layer assembly 10. The solder mask layer 18 covers the exposed outer surfaces of the first outer layer circuit 15, the second outer layer circuit 16, the first insulating element 13, and the second insulating element 14.

As shown in FIG. 2 to FIG. 14, a method for manufacturing the embedded circuit board 1 is also disclosed.

A manufacturing method of embedded circuit board 1 comprises the following steps:

Step S1: provide an inner layer conductive component 110, the inner layer conductive component 110 includes a core board 21, insulating substrates 112, and inner layer conductive circuits 111. Insulating substrates 112 and inner layer conductive circuits 111 are stacked in sequence on each side of the core board 21. The inner layer conductive component 110 further includes a first slot 27. The first slot 27 penetrates through the inner layer conductive component 110.

Figure 2:
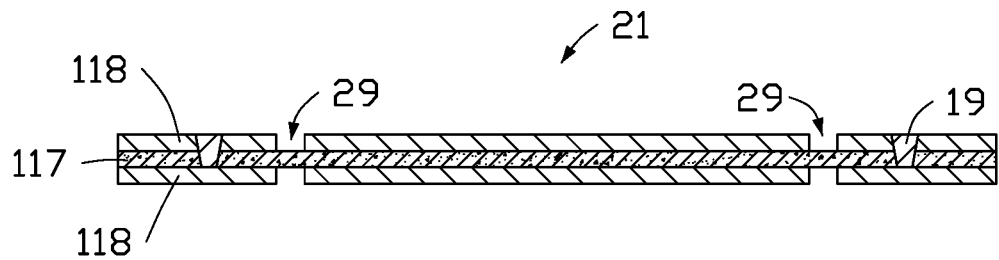
FIGS. 2-14 are schematic views illustrating a manufacturing process of an embedded circuit board.

The fabrication of the inner layer conductive component 110 includes the following steps:

Step S1-1: As shown in FIG. 2, provide the core board 21. The core board 21 includes a center layer 117 and two center conductive circuits 118. The center conductive circuits 118 are on each of the two sides of the center layer 117.

Each center conductive circuit 118 is provided with at least two pre-cut slits 29 arranged at intervals. The pre-cut slits 29 expose the center layer 117. The projections of the pre-cut slits 29 on the two center conductive circuits 118 disposed on two sides of the center layer 117 are perpendicular to the plane of the center layer 117.

Conductive pillars 19 are formed to electrically connect the two center conductive circuits 118.

Figure 3:
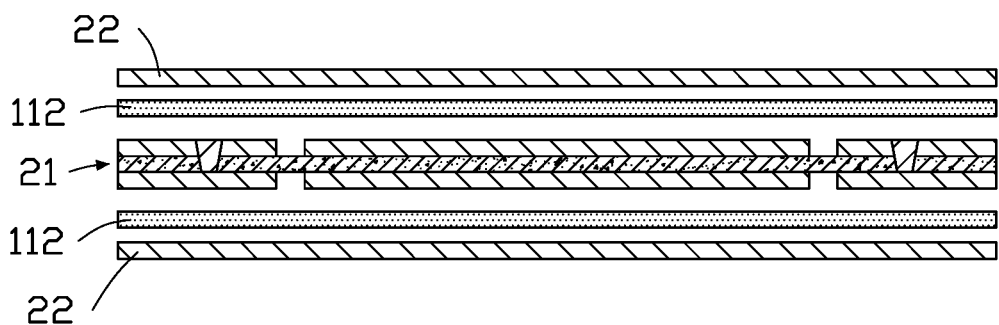

Step S1-2: as shown in FIG. 3, an insulating substrate 112 and a conductive layer 22 are laminated in sequence on each of two sides of the core board 21.

Figure 4:
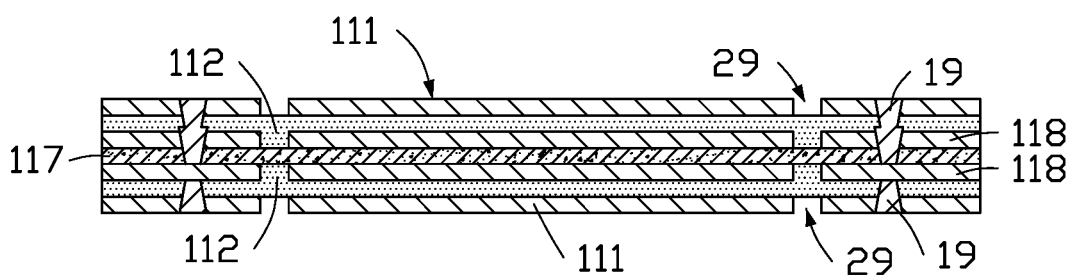

Step S1-3: as shown in FIG. 4, photo-etching the conductive layer 22 to obtain the inner layer conductive circuit 111. Wherein, each inner layer conductive circuit 111 is provided with at least two pre-cut slits 29 arranged at intervals. The pre-cut slits 29 expose the insulating substrate 112. The projections of the pre-cut slits 29 disposed on the two inner layer conductive circuits 111 on the side of the insulating substrate 112 away from the center layer 117 are perpendicular to the center layer 117. In the plane direction perpendicular to the center layer 117, the projections of the pre-cut slits 29 provided on the inner layer conductive circuit 111 and the projections of the pre-cut slits 29 provided on the center conductive circuit 118 are overlap.

The conductive pillars 19 are formed to electrically connect the inner layer conductive circuit 111 and the center conductive circuit 118.

Figure 5:
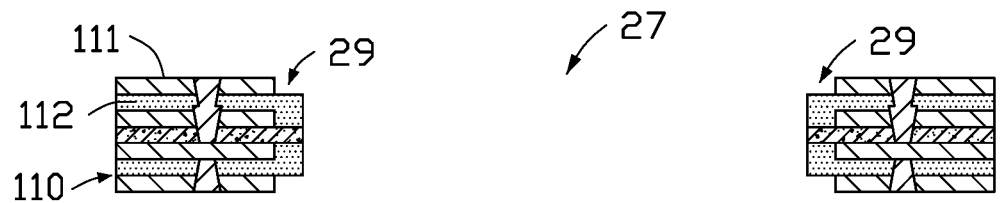

Step S1-4: as shown in FIG. 5, cutting the inner layer conductive component 110 along the pre-cutting slit 29 to form a first slot 27 penetrating the inner layer conductive component 110. The first slot 27 completely penetrates the inner layer conductive component 110.

Figure 6:
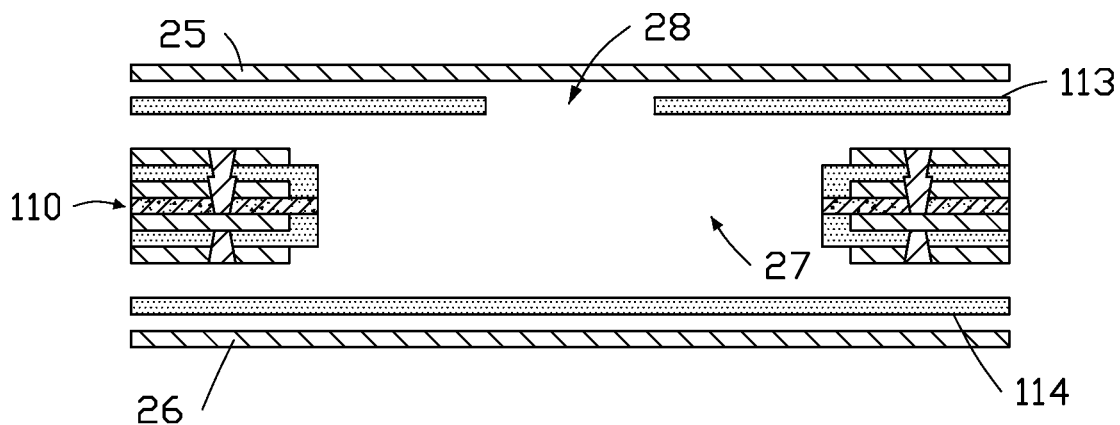

Step S2: as shown in FIG. 6, provide a first insulating layer 113, a second insulating layer 114, a first conductive material layer 25, and a second conductive material layer 26. Second slot 28 is formed on the first insulating layer 113 to correspond to the first slot 27. The second insulating layer 114 is arranged on the side of the inner layer conductive component 110 away from the first insulating layer 113. The first conductive material 25 is arranged on the side of the first insulating layer 113 away from the inner layer conductive component 110. The second conductive material 26 is arranged on the side of the second insulating layer 114 away from the inner layer conductive element 110.

Step S3: pressing the first insulating layer 113, the second insulating layer 114, the first conductive material layer 25, the second conductive material layer 26, and the inner layer conductive component 110 to form a first groove 103;

In one embodiment, the materials of the first insulating layer 113 and the second insulating layer 114 are semi-fluid materials.

The first insulating layer 113 covers the surface of the inner layer conductive component 110 facing the first groove 103. The first insulating layer 113 extends from the surface of the inner layer conductive component 110 away from the second insulating layer 114 to the surface of the inner layer conductive component 110 facing the first groove 103. The first insulating layer 113 is connected with the second insulating layer 114.

Figure 7:
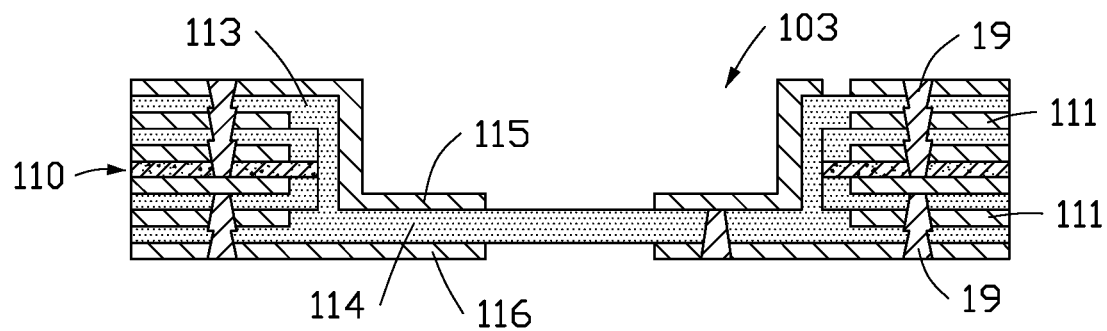

Step S4: as shown in FIG. 7, photo-etching the first conductive material layer 25 to obtain a first conductive circuit 115, and photo-etching the second conductive material layer 26 to obtain a second conductive circuit 116.

Forming the conductive pillars 19, the conductive pillars 19 electrically connecting the first conductive circuit 115 and the second conductive circuit 116 to the inner layer conductive circuit 111.

Figure 8:
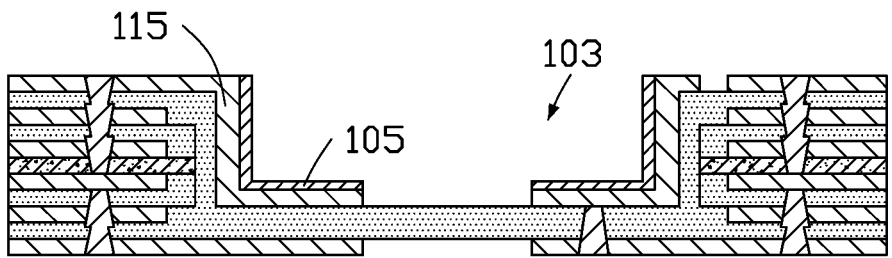

Step S5: as shown in FIG. 8, a first connection layer 105 is formed on the surface of the first conductive circuit 115 disposed on the first groove 103 by ENIG (Electroless Nickel/Immersion Gold), so that the first connection layer 105 is electrically connected to the first conductive circuit 115.

Figure 9:
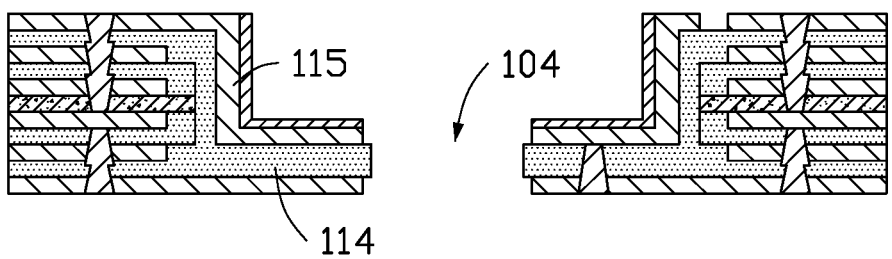

Step S6: as shown in FIG. 9, the part of the second insulating layer 114 which is not covered by the first conductive circuit 115 is removed, forming a first opening 104 and obtaining an inner layer assembly 11.

Figure 10:
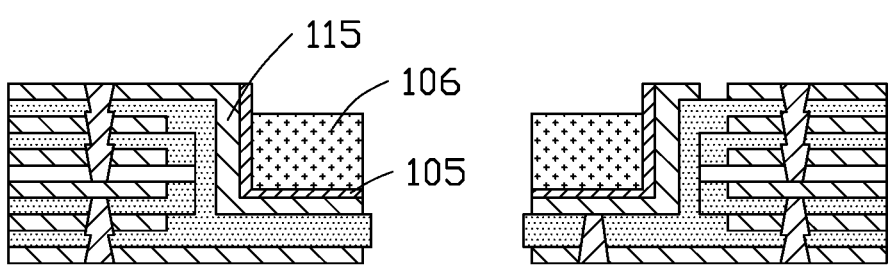

Step S7: As shown in FIG. 10, applying a conductive paste on the surface of the first connection layer 105 away from the first conductive circuit 115 to form a second connection layer 106, so that the second connection layer 106 and the first connection layer 105 are electrically connected.

Step S8: providing an embedded element 12, and disposing the embedded element 12 in the first groove 103.

Figure 11:
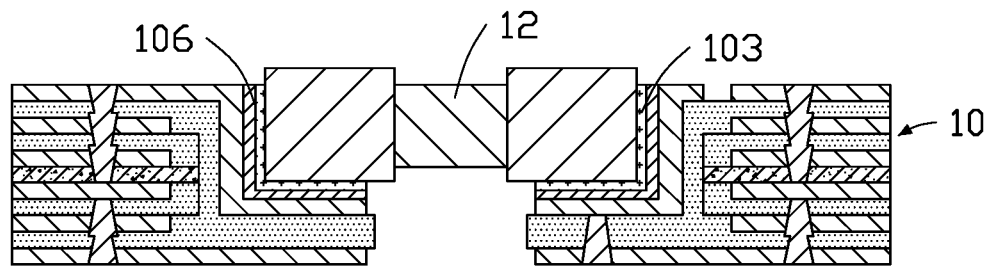

As shown in FIG. 11, the embedded element 12 is arranged in the first groove 103, the embedded element 12 is fixed to the inner layer assembly 10, and the embedded element 12 is electrically connected to the second connection layer 106.

Step S9: The first insulating element 13 and the second insulating element 14 are applied to cover the outer surface of the inner layer assembly 10, thus the exposed surfaces on the opposite sides of the embedded element 12 are respectively covered by the first insulating element 13 and the second insulating element 14.

Figure 12:
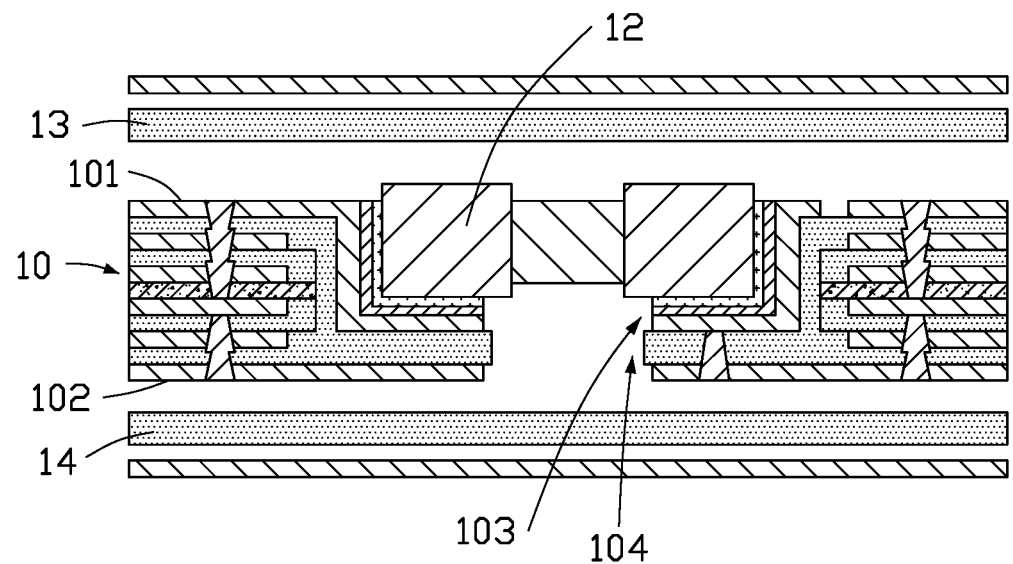
Figure 13:
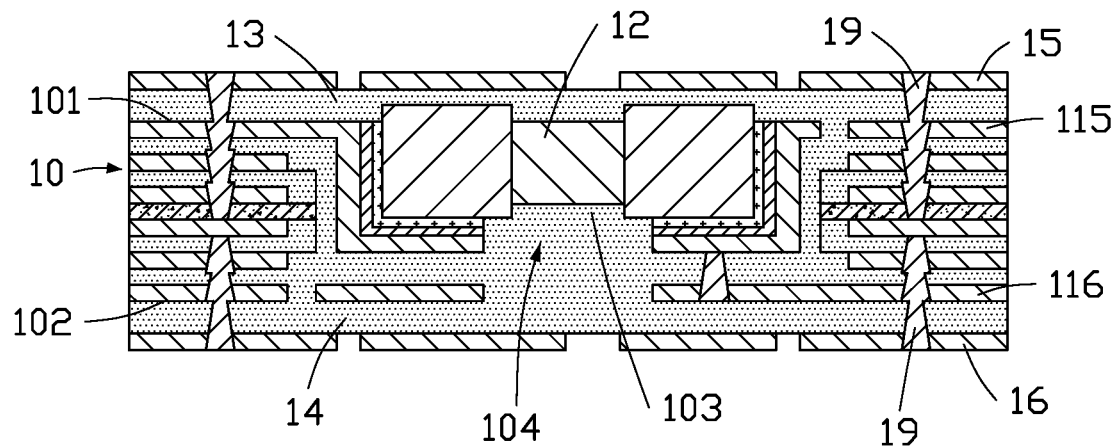

In one embodiment, as shown in FIG. 12 and FIG. 13, the first insulating element 13 and the second insulating element 14 are formed by layer-up lamination. The inner layer assembly 10 further includes a first surface 101 and a second surface 102 opposite to each other. The first groove 103 does not extend to the second surface 102. The first opening 104 penetrates through the second surface 102 and communicates with the first groove 103. The first insulating element 13 covers the first surface 101 and the embedded element 12 away from the second surface 102. The second insulating element 14 covers the second surface 102. The second insulating element 14 is in contact with the embedded element 12 through the first opening 104.

Step S10: as shown in FIG. 12 and FIG. 13, a first outer layer circuit 15 is formed on the surface of the first insulating element 13 away from the second insulating element 14. A second outer layer circuit 16 is formed on the surface of the second insulating element 14 away from the first insulating element 13.

The conductive pillars 19 are formed. So that the first outer layer circuit 15 is electrically connected to the first conductive circuit 115 by the conductive pillars 19, and the second outer layer circuit 16 is electrically connected to the second conductive circuit 116 by the conductive pillars 19.

Figure 14:
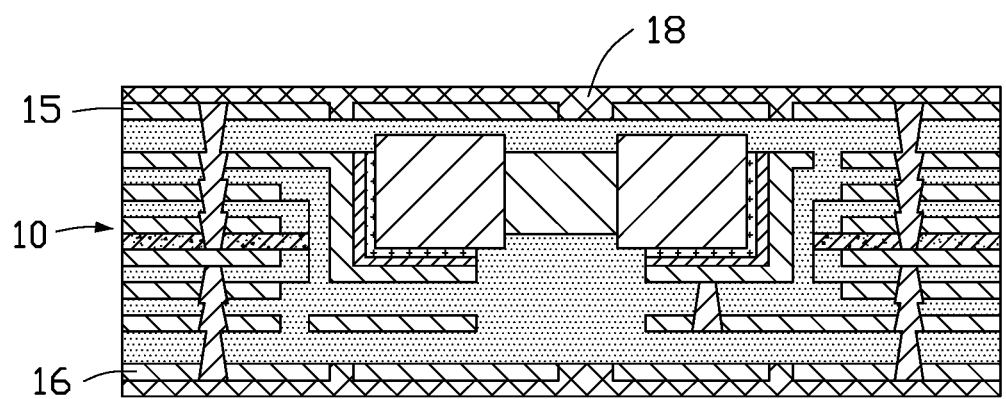

Step S11: As shown in FIG. 14, a solder mask layer 18 is formed on sides of the first and second outer layer circuits 15 and 16 away from the inner layer assembly 10.

The embodiments shown and described above are only examples. Therefore, many commonly-known features and details are neither shown nor described. Even though numerous characteristics and advantages of the present technology have been set forth in the foregoing description, together with details of the structure and function of the present disclosure, the disclosure is illustrative only, and changes may be made in the detail, including in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A manufacturing method of embedded a circuit board, comprising: providing an inner layer conductive component, wherein the inner layer conductive component comprises a core board, an insulating substrate, and an inner layer conductive circuit, the insulating substrate and the inner layer conductive circuit are sequentially stacked and arranged on two sides of the core board, a first slot is formed on the inner layer conductive component, the first slot completely penetrates the inner layer conductive component; providing a first insulating layer, a second insulating layer, a first conductive material layer, and a second conductive material layer, wherein a second slot is formed in the first insulating layer, making a position of the first slot correspond to a position of the second slot, the second insulating layer is arranged on a side of the inner layer conductive component away from the first insulating layer, and the first conductive material layer is arranged on the first insulating layer away from the inner layer conductive component on a side of a conductive assembly, the second conductive material layer is arranged on a side of the second insulating layer away from an inner conductive assembly; pressing the first insulating layer, the second insulating layer, the first conductive material layer, the second conductive material layer, and the inner layer conductive component to form a first groove; processing the first conductive material layer to obtain a first conductive circuit, processing the second conductive material layer to obtain a second conductive circuit, removing a part of the second insulating layer that does not cover by the first conductive circuit and the second conductive circuit to obtain a first opening, thereby obtaining an inner layer assembly; providing an embedded element, and disposing the embedded element in the first groove; and providing a first insulating element and a second insulating element, making the first insulating element and the second insulating element cover an outer surface of the inner layer assembly, and cover exposed surfaces on opposite sides of the embedded element, wherein disposing the embedded element in the first groove further comprises: forming a first connection layer on a surface of the first conductive circuit disposed on the first groove by Electroless Nickel/Immersion Gold (ENIG), making the first connection layer electrically connected to the first conductive circuit; disposing a conductive paste on a surface of the first connection layer away from the first conductive circuit to form a second connection layer, making the second connection layer electrically connected to the first connection layer; and putting the embedded element in the first groove, making the embedded element be fixed to the inner layer assembly, and making the embedded element be electrically connected to the second connection layer.

2. The manufacturing method of claim 1, wherein providing the inner layer conductive component further comprises: providing the core board, wherein the core board comprises a center layer and two center conductive circuits, and the two center conductive circuits are respectively arranged on two sides of the center layer; sequentially laminating an insulating substrate and a conductive layer on each of two sides of the core board; photo-etching the conductive layer to obtain the inner layer conductive circuit; and the first slot is formed through multiple layers of the inner layer conductive circuit and the insulating substrate.

3. The manufacturing method of embedded circuit board of claim 1, wherein the first insulating layer covers a surface of the inner conductive assembly facing the first groove, the first insulating layer extends from a surface of the inner layer conductive component away from the second insulating layer to the surface of the inner layer conductive component facing the first groove, the first insulating layer is connected to the second insulating layer.

4. The manufacturing method of embedded circuit board of claim 1, wherein the first insulating element and the second insulating element are formed by pressure buildup, the inner layer assembly comprises a first surface and a second surface disposed opposite to each other, the first groove does not extend to the second surface, the first opening penetrates the second surface and communicates with the first groove, the first insulating element covers the first surface and a surface of the embedded element away from the second surface, the second insulating element covers the second surface and contacts the embedded element through the first opening, the manufacturing method further comprising: forming a first outer layer circuit on a surface of the first insulating element away from the second insulating element; forming a second outer layer circuit on a surface of the second insulating element away from the first insulating element; and forming a solder mask layer on a side of the first outer layer circuit away from the inner layer assembly and a side of the second outer layer circuit away from the inner layer assembly.

5. The manufacturing method of embedded circuit board of claim 2, wherein each of the two center conductive circuits is provided with at least two pre-cut slits arranged at intervals, the at least two pre-cut slits expose the center layer, projections of the at least two pre-cut slits on the two center conductive circuits disposed on the two sides of the center layer are overlapped in a direction perpendicular to a plane of the center layer.

6. The manufacturing method of embedded circuit board of claim 5, wherein each of the inner layer conductive circuit is provided with at least two second pre-cut slits arranged at intervals, the at least two second pre-cut slits expose the insulating substrate, in the direction perpendicular to the plane of the center layer, projections of the at least two second pre-cut slits disposed on two inner layer conductive circuits on a side of the insulating substrate away from the center layer are overlapped.

7. The manufacturing method of embedded circuit board of claim 6, wherein on a plane perpendicular to the plane of the center layer, the projections of the at least two second pre-cut slits provided on the inner layer conductive circuit and the projections of the at least two pre-cut slits provided on the center conductive circuit are overlapped.

\* \* \* \* \*